(12) United States Patent
Kim

(10) Patent No.: US 7,691,705 B2
(45) Date of Patent: Apr. 6, 2010

(54) METHOD FOR MANUFACTURING FLASH MEMORY CELL BY RIE SLOPE ETCHING REFLOWED PHOTORESIST PATTERN

(75) Inventor: Tae-Ho Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 149 days.

(21) Appl. No.: 11/613,783

(22) Filed: Dec. 20, 2006

(65) Prior Publication Data
US 2007/0155095 A1    Jul. 5, 2007

(30) Foreign Application Priority Data
Dec. 30, 2005    (KR) .................. 10-2005-0135335

(51) Int. Cl.
*H01L 21/336*    (2006.01)
*H01L 21/28*    (2006.01)
(52) U.S. Cl. .................. 438/257; 438/578
(58) Field of Classification Search .......... 257/258, 257/261–264, 593, 594, 713, 978, E21.179, 257/E21.205, E21.209
See application file for complete search history.

(56) References Cited

U.S. PATENT DOCUMENTS

| 4,487,652 | A | * | 12/1984 | Almgren | 438/713 |
| 6,284,637 | B1 | * | 9/2001 | Chhagan et al. | 438/594 |
| 6,514,868 | B1 | * | 2/2003 | Hui et al. | 438/713 |
| 2001/0019127 | A1 | * | 9/2001 | Ishida | 257/59 |
| 2002/0022364 | A1 | * | 2/2002 | Hatta et al. | 438/673 |
| 2005/0142741 | A1 | * | 6/2005 | Yang et al. | 438/257 |
| 2005/0230348 | A1 | * | 10/2005 | Kido | 216/58 |

* cited by examiner

*Primary Examiner*—Matthew Smith
*Assistant Examiner*—Walter H Swanson
(74) *Attorney, Agent, or Firm*—Sherr & Vaughn, PLLC

(57) ABSTRACT

A method for manufacturing a flash memory cell with a floating gate and a control gate having an increased coupling ratio due to an increase in gate capacitance. The gate size is increased by reducing a groove width in a photoresist pattern used to define the gate region. The groove width is reduced by employing a slope-etching process to form the photoresist pattern.

7 Claims, 5 Drawing Sheets

METHOD FOR MANUFACTURING FLASH MEMORY CELL BY RIE SLOPE ETCHING REFLOWED PHOTORESIST PATTERN

The present application claims priority under 35 U.S.C. 119 and 35 U.S.C. 365 to Korean Patent Application No. 10-2005-0135335 (filed on Dec. 30, 2005), which is hereby incorporated by reference in its entirety.

BACKGROUND

A flash memory cell has advantages similar to an erasable programmable read only memory (EPROM) and an electrically erasable and programmable read only memory (EEPROM). A flash memory cell includes a floating gate, an insulating layer, a control gate, a tunnel oxide layer, and an isolation layer formed over a silicon substrate. The flash memory cell also includes a source and drain region formed on an exposed portion of a silicon substrate. The flash memory cell can electrically store and erase 1-bit using one transistor.

The flash memory cell stores charges in the floating gate and the floating gate is insulated from the control gate. Data is stored and erased by applying power to the control gate which is coupled to the floating gate through the insulating material. The ratio of power transferred from the control gate to the floating gate through the insulating material is referred to as a coupling ratio. The value of the coupling ratio is proportional to the capacitance generated by an overlap between the floating gate and the control gate.

FIGS. 1A to 1D are flow diagrams showing a process of manufacturing a flash memory cell.

Referring to FIG. 1A, after a trench is formed by etching a predetermined region of a semiconductor substrate 100, a device isolation layer 102 is formed by a series of processes for burying an insulator into the trench. A first oxide layer 104, a first polycrystalline silicon layer 106, an insulating layer 108 and a photoresist pattern 110 for defining a floating gate are sequentially formed over the substrate 100 on which the device isolation layer 102 is formed. The first oxide layer 104 is deposited with a thickness ranging from approximately 90 Å to 100 Å and the first polycrystalline silicon layer 106 is deposited with a thickness ranging from approximately 950 Å to 1050 Å. The insulating layer 108 is deposited by using e.g., a nitride layer, a tetra ethyl ortho silicate (TEOS) or the like, at a thickness ranging from 2200 Å to 2300 Å.

After the insulating layer 108 is anisotropically etched along the photoresist pattern 110, the photoresist pattern 110 is removed by an ashing process using, e.g., Ar, O$_2$ or the like, so that a floating gate region is defined through the patterned insulating layer 108, as shown in FIG. 1B.

After an insulator, e.g., TEOS or a nitride layer, is deposited on the semiconductor substrate 100 where a floating gate region is defined with a thickness ranging from approximately 740 Å to 760 Å, a spacer insulating layer 112 is formed on side surfaces of a patterned slot of the insulating layer 108 by performing reactive ion etching (RIE) on the deposited insulator, as shown in FIG. 1C.

Thereafter, as shown in FIG. 1D, a floating gate 106a is formed by etching the first polycrystalline silicon layer 106 and the first oxide layer 104 by using the insulating layer 108 and the spacer insulating layer 112 as a mask so that the device isolation layer 102 is exposed. Thereafter, a control gate 116 is formed by removing the spacer insulating layer 112 and the insulating layer 108 and by sequentially depositing a second insulating layer 114 and a second polycrystalline silicon layer on an upper surface of the semiconductor substrate 100.

Accordingly, for increasing a capacitance of a floating gate and a control gate, after an insulator is patterned through a photolithography process, a patterning process is repeatedly performed using an insulator to form a fine pattern. Accordingly, it takes long time to perform the manufacturing process and production yield is decreased due to a difficulty of forming the fine pattern.

SUMMARY

Embodiments relate to a method for manufacturing a flash memory cell; and, more particularly, to a method for manufacturing a flash memory cell by simplifying processes of forming a floating gate and a control gate.

Embodiments relate to a method for manufacturing a flash memory cell for increasing a capacitance of a gate by forming a fine pattern through a reflow process after a photoresist pattern is formed.

Embodiments relate to a method for manufacturing a flash memory cell with a gate line of a floating gate and a control gate, the method including the steps of depositing a first oxide layer over a semiconductor substrate having a device isolation layer; depositing a first polycrystalline silicon layer over the first oxide layer; forming a floating gate photoresist pattern over the first polycrystalline silicon layer; slope etching the photoresist pattern through a photoresist reflow process; forming a floating gate by etching the first polycrystalline silicon layer and the first oxide layer along the slope etched photoresist pattern to expose the isolation layer; removing the photoresist pattern; and forming the control gate by sequentially depositing a second oxide layer and a second polycrystalline silicon layer over the semiconductor substrate and the floating gate.

The slope etching may be performed through a reactive ion etching (RIE) process.

The reactive ion etching may be performed under a pressure condition of approximately 60 mTorr to 80 mTorr.

The reactive ion etching may be performed with a power input of approximately 50 W to 100 W.

The slope etching creates a sloped sidewall in a groove in the etched photoresist pattern which causes a decrease in the width of a groove in the photoresist pattern. The process creates a groove width in the photoresist pattern smaller than a critical dimension of the semiconductor device fabrication process.

BRIEF DESCRIPTION OF THE DRAWINGS

Example

Example

DETAILED DESCRIPTION

A first oxide layer and a first polycrystalline silicon layer are formed sequentially over a semiconductor substrate where a device isolation layer is formed; and a photoresist pattern which defines a floating gate forming region is formed over the semiconductor substrate; and the photoresist pattern is slope etched through a photoresist reflow process; and a floating gate is formed by etching along the slope etched photoresist pattern; and a control gate is formed by sequentially depositing a second oxide layer and a second polycrystalline silicon layer over a top of the semiconductor substrate where the floating gate is formed. Using this method, the object of the embodiments can be easily achieved.

Figure 1A:
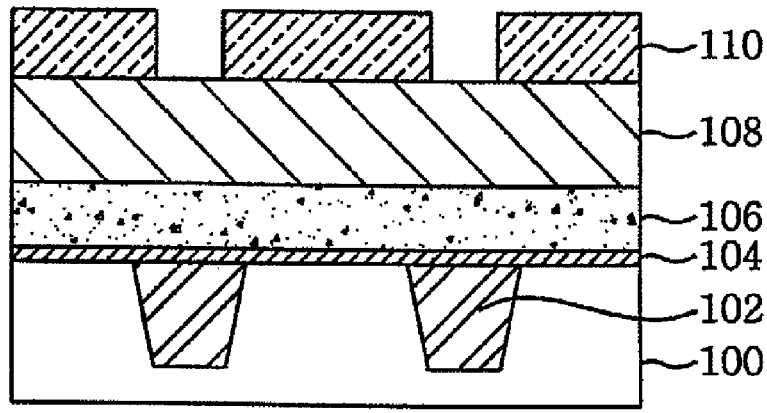
FIGS. 1A to 1D are process flow diagrams showing a process of manufacturing a flash memory cell according to a prior art.
Figure 1B:
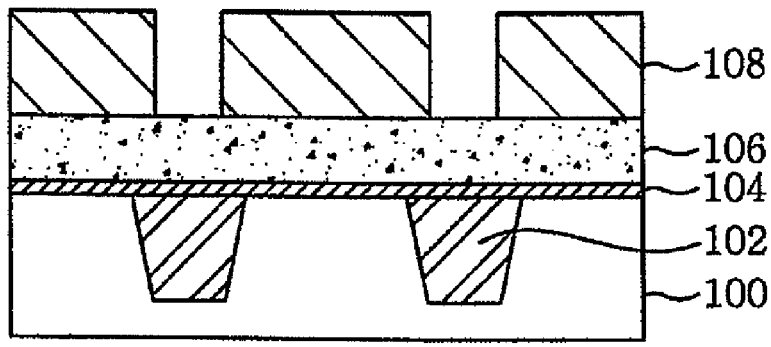
Figure 1C:
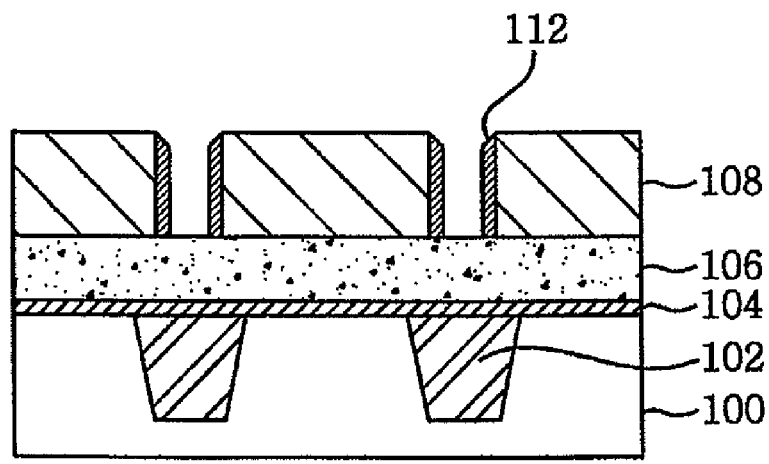
Figure 1D:
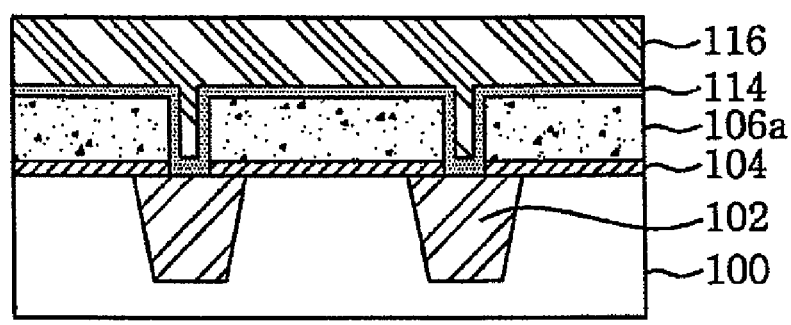
Figure 2:
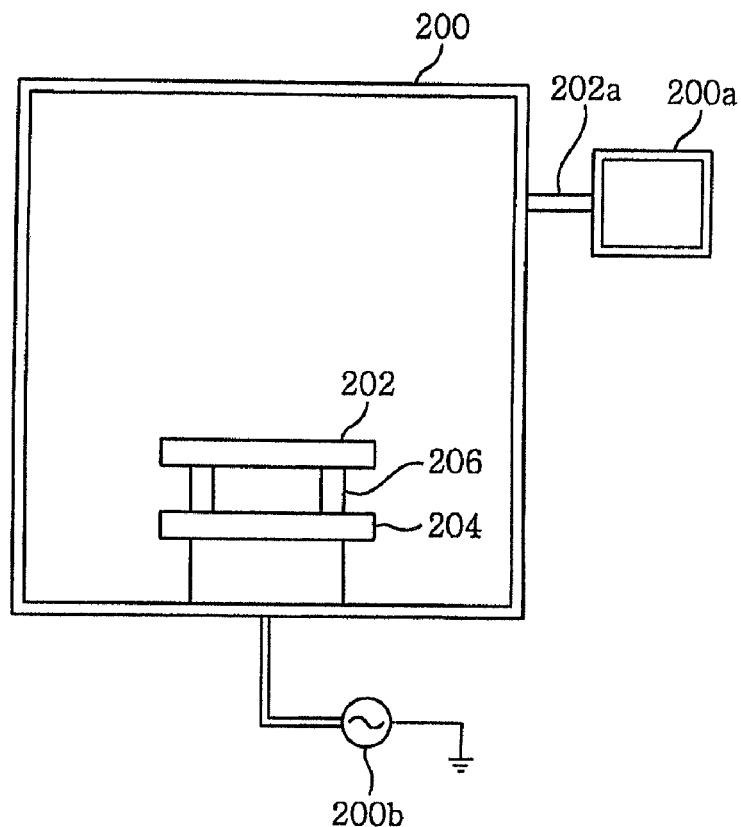
FIG. 2 is a diagram schematically depicting a reactive ion etching apparatus for manufacturing a flash memory cell in accordance with embodiments.

FIG. 2 is a diagram schematically depicting a reactive ion etching apparatus for manufacturing a flash memory cell in accordance with embodiments, wherein the reactive ion etching apparatus includes a chamber 200, a reactive gas storing unit 200a and a power supply unit 200b. A wafer 202, a wafer chuck 204 for lifting and supporting the wafer 202 and a wafer lift 206 for moving the wafer 202 up and down are included in the chamber 200. In addition, a reactive gas injection pipe 202a is installed on a top portion of the chamber 200 to supply an etchant gas from the reactive gas storing unit 200a. The chamber 200 is connected to the power supply unit 200b for supplying power.

By using the above-mentioned reactive ion etching device, a first oxide layer, a polycrystalline silicon layer and an insulating layer are sequentially formed over a semiconductor substrate where a device isolation layer is formed; after the insulating layer is slope etched, a floating gate is formed by etching the polycrystalline silicon layer and the first oxide layer by using the slope etched insulating layer as a mask; a second oxide layer is formed over the floating gate; and a control gate is formed over the second oxide layer.

FIGS. 3A to 3D are process flow diagrams depicting a process of fabricating the flash memory cell in accordance with embodiments. FIG. 4 is a layout of the flash memory cell fabricated in accordance with embodiments. The method of fabricating the flash memory cell in accordance with embodiments will be described with reference to the accompanying drawings.

Figure 3A:
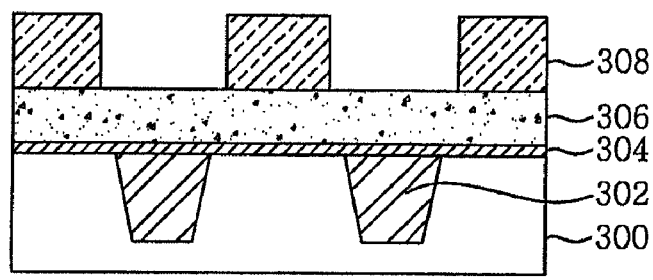
FIGS. 3A to 3D are process flow diagrams showing a process of fabricating the flash memory cell in accordance with embodiments; and Example
Figure 4:
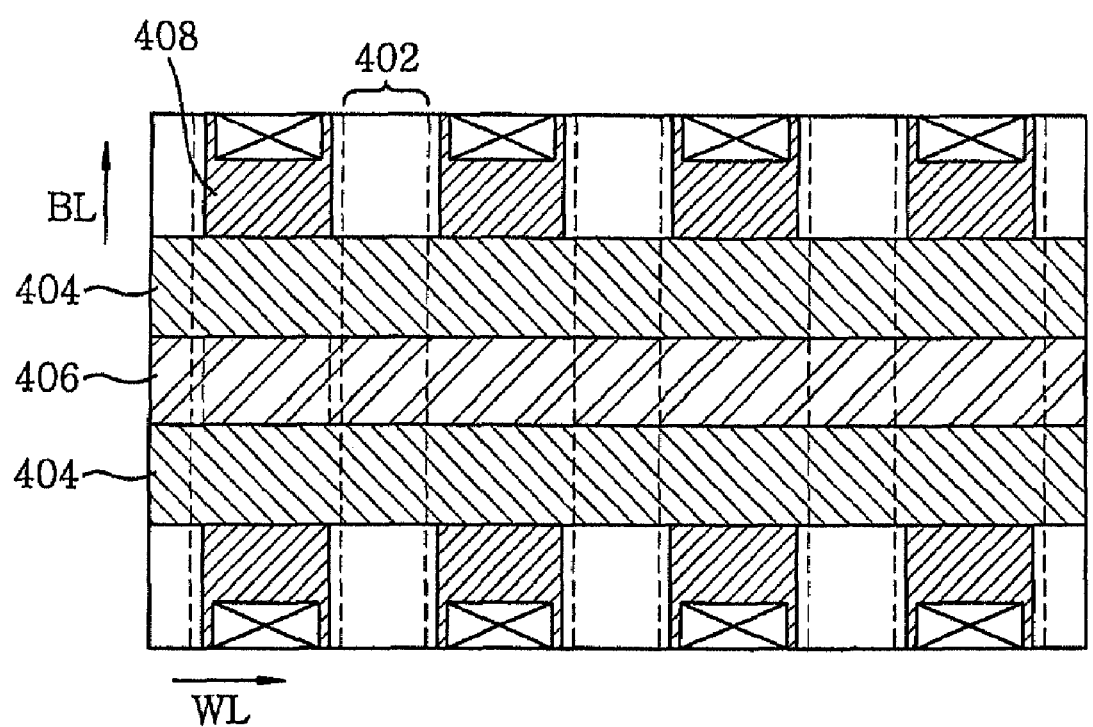
FIG. 4 is a layout of the flash memory cell fabricated in accordance with embodiments.

Referring to FIG. 3A, after a trench is formed by etching a predetermined region of a semiconductor substrate 300, a device isolation layer 302 is formed by performing a series of processes for burying an insulating material into the trench. A first oxide layer 304, a first polycrystalline silicon layer 306 and a photoresist pattern 308 for defining a floating gate are sequentially formed over the device isolation layer 302. The first oxide layer 304 is deposited with a thickness ranging from approximately 90 Å to 100 Å and the first polycrystalline silicon layer 306 can be deposited with a thickness ranging from approximately 950 Å to 1050 Å. The formed trench corresponds to a trench line 402 shown in FIG. 4 and a plurality of trench lines 402 are formed in parallel to a direction of a bit line BL.

Figure 3B:
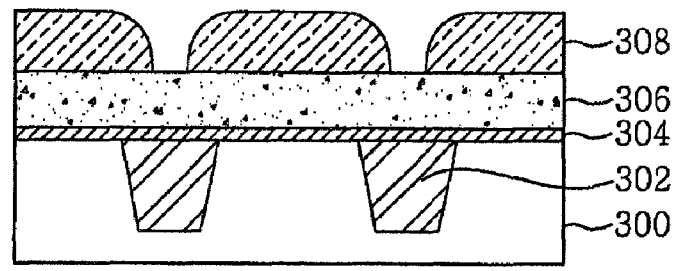

A top portion of the semiconductor substrate 300 is slope etched through a photoresist reflow process, whereby the already patterned and etched photoresist layer shown in FIG. 3A is reetched and shaped into a pattern with rounded transitions from the top surfaces to the sidewalls, and narrower grooves or holes exposing polycrystalline silicon layer 306 as shown in FIG. 3B. The grooves or holes in the photoresist pattern 308 with the inclining sidewalls will be used to etch a floating gate pattern.

Herein, the slope etching through the photoresist reflow process is performed by reactive ion etching (RIE), under a pressure of approximately 60 mTorr to 80 mTorr in the chamber and at a power of approximately 50 W to 100 W supplied through the power supply unit 200b using the reactive ion etching device shown in FIG. 2.

Since the photoresist pattern 308 obtained through the above-mentioned photoresist reflow process is patterned into wider area, the width of a groove in the insulating layer is reduced relative to a groove patterned exclusively through an anisotropic etching process. This is because sides of the groove are formed to be inclined with a predetermined angle θ through the photoresist reflow process. Therefore, since a smaller groove is formed, a semiconductor device which has features smaller than a standard critical dimension (CD), for example, features smaller than 0.18 μm in a 0.18 μm process which otherwise has 0.18 μm design rules, can be fabricated.

Figure 3C:
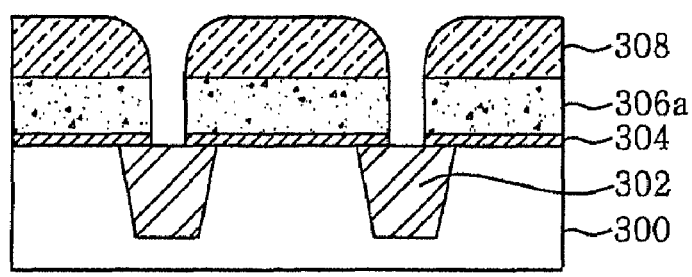

Thereafter, the first polycrystalline silicon layer 306 and the first oxide layer 304 are etched along the photoresist pattern 308 until the device isolation layer 302 is exposed. In this way, a floating gate 306a is formed, as shown in FIG. 3C.

Figure 3D:
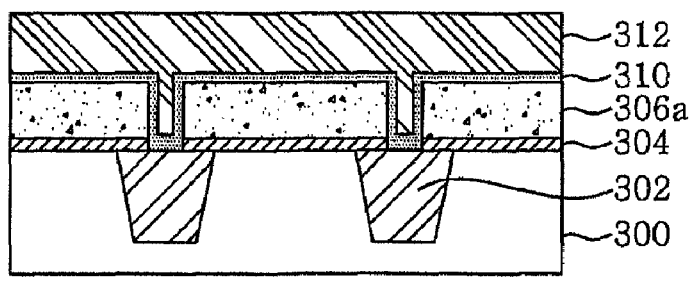

Thereafter, after removing the photoresist pattern 308, a control gate 312 is formed by sequentially depositing a second oxide layer 310 and a second polycrystalline silicon layer over the whole top surface of the semiconductor substrate 300 where the floating gate 306a is formed, as shown in FIG. 3D. Through this process, as shown in FIG. 4, a plurality of gate lines 404 are formed parallel to a direction of a word line WL, and the floating gate 306a is formed between neighboring device isolation areas 302 (see FIG. 3D). The control gate 312 is formed over the floating gate 306a and the device isolation layer 302.

Next, as shown in FIG. 4, a source region 406 and a drain region 408 are formed by injecting impurity ions on the semiconductor substrate 300, using the gate line 404 including the floating gate 306a and the control gate 312 as a mask.

Therefore, in the accordance with embodiments, a slope etching process is performed through a reflow process for a photoresist pattern to sequentially form a floating gate and a control gate during the fabrication of a flash memory cell.

As above-mentioned, in accordance with embodiments, a photoresist pattern is slope etched through a reactive ion etching process under a pressure of approximately 60 mTorr to 80 mTorr in the chamber, at a power of approximately 50 W to 100 W. The manufacturing process can be simplified and the manufacturing cost reduced, while production yield is increased by forming a floating gate along the photoresist pattern patterned through this process.

By using the photoresist pattern, which has a slope formed through a slope etching process in a photoresist reflow process, as a floating gate mask, a fine pattern may be formed for a semiconductor device having a feature smaller than a regular critical dimension, for example 0.18 μm. Therefore, errors in a pattern generated due to a complicated fabricating process can be prevented and, thus, the reliability of a semiconductor unit can be improved.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   depositing a first oxide layer over a semiconductor substrate having a device isolation layer;
   depositing a first polycrystalline silicon layer over the first oxide layer;
   forming a floating gate photoresist pattern over the first polycrystalline silicon layer;
   slope etching the photoresist pattern through a photoresist reflow process;
   forming a floating gate by etching the first polycrystalline silicon layer and the first oxide layer along the slope etched photoresist pattern to expose the isolation layer;

removing the photoresist pattern; and forming a control gate by sequentially depositing a second oxide layer and a second polycrystalline silicon layer over the semiconductor substrate and the floating gate.

2. The method of claim 1, wherein the slope etching comprises a reactive ion etching (RIE) process.

3. The method of claim 2, wherein the reactive ion etching is performed under a pressure of approximately 60 mTorr to 80 mTorr.

4. The method of claim 2, wherein the reactive ion etching is performed using a power input between approximately 50 W and 100 W.

5. The method of claim 1, wherein said slope etching creates a sloped sidewall in a groove in the etched photoresist pattern.

6. The method of claim 1, wherein said slope etching process causes a decrease in the width of a groove in the photoresist pattern.

7. The method of claim 1, wherein said slope etching process creates a groove width in the photoresist pattern smaller than a critical dimension of the semiconductor device fabrication process.

* * * * *